US 11,650,513 B2
United States Patent
Goorden
(45) Date of Patent: May 16, 2023

(54) APPARATUS AND METHOD FOR MEASURING A POSITION OF A MARK

(71) Applicant: ASML Netherlands B.V., Veldhoven (NL)

(72) Inventor: Sebastianus Adrianus Goorden, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 17/280,711

(22) PCT Filed: Sep. 5, 2019

(86) PCT No.: PCT/EP2019/073658
§ 371 (c)(1),
(2) Date: Mar. 26, 2021

(87) PCT Pub. No.: WO2020/064290
PCT Pub. Date: Apr. 2, 2020

(65) Prior Publication Data
US 2021/0382403 A1 Dec. 9, 2021

(30) Foreign Application Priority Data
Sep. 27, 2018 (EP) .................................. 18197076

(51) Int. Cl.
*G03F 9/00* (2006.01)
(52) U.S. Cl.
CPC .......... *G03F 9/7088* (2013.01); *G03F 9/7046* (2013.01); *G03F 9/7049* (2013.01); *G03F 9/7065* (2013.01); *G03F 9/7076* (2013.01)
(58) Field of Classification Search
CPC .. G03F 7/70633; G03F 9/7088; G03F 9/7069; G03F 9/7065; G03F 9/7049; G03F 9/7046
See application file for complete search history.

(56) References Cited

U.S. PATENT DOCUMENTS 5,347,356 A * 9/1994 Ota ..................... G03F 7/70633
356/490
6,952,253 B2 10/2005 Lof et al.
(Continued)

FOREIGN PATENT DOCUMENTS

JP H05-166695 A 7/1993
JP H08-288197 A 11/1996
(Continued)

OTHER PUBLICATIONS

International Search Report and Written Opinion of the International Searching Authority directed to related International Patent Application No. PCT/EP2019/073658, dated Dec. 11, 2019; 11 pages.
(Continued)

*Primary Examiner* — Steven Whitesell Gordon
(74) *Attorney, Agent, or Firm* — Sterne, Kessler, Goldstein & Fox P.L.L.C.

(57) ABSTRACT

An apparatus for measuring a position of a mark on a substrate, the apparatus comprising: an illumination system configured to condition at least one radiation beam to form a plurality of illumination spots spatially distributed in series such that during scanning of the substrate the plurality of illumination spots are incident on the mark sequentially, and a projection system configured to project radiation diffracted by the mark from the substrate, the diffracted radiation being produced by diffraction of the plurality of illumination spots by the mark; wherein the projection system is further configured to modulate the diffracted radiation and project the modulated radiation onto a detecting system configured to produce signals corresponding to each of the plurality of illumination spots, the signals being combined to determine the position of the mark.

14 Claims, 9 Drawing Sheets

(56) References Cited

U.S. PATENT DOCUMENTS

| | | |
|---|---|---|
| 6,961,116 B2 | 11/2005 | Den Boef et al. |
| 9,716,193 B2 | 7/2017 | Sengupta |
| 2005/0275840 A1* | 12/2005 | Gui .................... G03F 7/70275 |
| | | 356/400 |
| 2007/0139645 A1 | 6/2007 | Shen et al. |
| 2009/0195768 A1 | 8/2009 | Bijnen et al. |
| 2012/0057171 A1* | 3/2012 | Khuat Duy ........... G03F 9/7049 |
| | | 356/494 |
| 2015/0261097 A1 | 9/2015 | Mathijssen et al. |
| 2016/0299326 A1 | 10/2016 | Eggert et al. |
| 2017/0255104 A1 | 9/2017 | Polo et al. |

FOREIGN PATENT DOCUMENTS

| | | |
|---|---|---|
| JP | H09 232204 A | 9/1997 |
| JP | 2004-134503 A | 4/2004 |

OTHER PUBLICATIONS

International Preliminary Report on Patentability directed to related International Patent Application No. PCT/EP2019/073658, dated Mar. 23, 2021; 8 pages.

* cited by examiner

APPARATUS AND METHOD FOR MEASURING A POSITION OF A MARK

CROSS-REFERENCE TO RELATED APPLICATIONS

This application claims priority of EP application 18197076.5, which was filed on 27 Sep. 2018 and which is incorporated herein in its entirety by reference.

FIELD

The present invention relates to an apparatus and method for measuring a position of a mark.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. One or more (e.g. a plurality of) alignment sensors may be part of a separate measurement, or alignment, system or a separate metrology tool. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

It is desirable to provide an apparatus and method for measuring a position of alignment marks which overcomes or mitigates one or more problems associated with the prior art.

SUMMARY

According to an aspect of the present invention there is provided an apparatus for measuring a position of a mark on a substrate, the apparatus comprising: an illumination system configured to condition at least one radiation beam to form a plurality of illumination spots spatially distributed in series such that during scanning of the substrate the plurality of illumination spots are incident on the mark sequentially, and a projection system configured to project radiation diffracted by the mark from the substrate, the diffracted radiation being produced by diffraction of the plurality of illumination spots by the mark; wherein the projection system is further configured to modulate the diffracted radiation and project the modulated radiation onto a detecting system configured to produce signals corresponding to each of the plurality of illumination spots, the signals being combined to determine the position of the mark.

This has an advantage that high speed alignment may be achieved with good reproducibility. Machine dynamics (e.g. vibrations) may be averaged out which alleviates the reproducibility impact of machine dynamics. Furthermore, enough photons can be measured such that good reproducibility is achieved.

The illumination system may be configured to direct the plurality of illumination spots such that there is a gap between adjacent illumination spots on the substrate.

The illumination system may be configured to direct the plurality of illumination spots such that there is no gap between adjacent illumination spots on the substrate.

The illumination system may be configured such that only one of the plurality of illumination spots is incident on the mark simultaneously.

The illumination system and the projection system may have at least one common optical component.

The apparatus may be for measuring the positions of a plurality of marks, wherein the illumination system may be configured such that when one of the plurality of illumination spots is incident on the mark, another of the plurality of illumination spots is incident on a further mark such that the position of the further mark is determined.

The projection system may comprise a movable mirror which is configured to be moved such that the diffracted radiation from each of the plurality of illumination spots is incident on one detector of the detecting system.

The illumination system may be configured such that a plurality of radiation beams are conditioned to each form at least one of the plurality of illumination spots.

The illumination system may comprise illumination sub-systems, wherein each illumination sub-system may be configured to condition at least one radiation beam from a separate one of a plurality of radiation sources to form at least one of the plurality of illumination spots.

The detecting system may be configured to produce signals such that provisional positions of the mark corresponding to each of the plurality of illumination spots are determined and the provisional positions are combined to produce the position of the mark.

The detecting system may be configured to produce signals to be combined into a combined signal which is used to produce the position of the mark.

According to an aspect of the present invention, there is provided a measurement system for measuring positions of marks on a substrate, the measurement system comprising: the apparatus of any preceding claim, and an additional apparatus, wherein the additional apparatus comprises: an additional illumination system configured to condition at least one additional radiation beam to form a plurality of additional illumination spots spatially distributed in series such that during scanning of the substrate the plurality of additional illumination spots are incident on an additional mark sequentially, and an additional projection system configured to project radiation diffracted by the additional mark from the substrate, the diffracted radiation being produced by diffraction of the plurality of additional illumination spots by the additional mark; wherein the additional projection system is configured to modulate the diffracted radiation and project the modulated radiation onto an additional detecting system configured to produce signals corresponding to each of the plurality of additional illumination spots, the signals being combined to determine the position of the additional mark in parallel with the measurement of the position of the mark by the apparatus.

According to an aspect of the present invention, there is provided a metrology apparatus comprising the apparatus as described above and/or the measurement system as described above.

According to an aspect of the present invention, there is provided a lithographic apparatus arranged to project a pattern from a patterning device onto a substrate, the lithographic apparatus comprising the apparatus of as described above and/or the measurement system as described above.

According to an aspect of the present invention, there is provided an apparatus for measuring a position of a mark on a substrate, the apparatus comprising: an illumination system configured to condition at least one radiation beam to form an illumination band such that during scanning of the substrate the illumination band is incident on the mark, and a projection system configured to project radiation diffracted by the mark from the substrate, the diffracted radiation being produced by diffraction of the illumination band by the mark; wherein the projection system is further configured to modulate the diffracted radiation and project the modulated radiation onto a detecting system configured to produce a signal corresponding to the illumination band to determine the position of the mark.

According to an aspect of the present invention, there is provided a method of measuring a position of a mark on a substrate, the method comprising: providing a measurement optical system comprising an illumination system configured to condition at least one radiation beam to form a plurality of illumination spots spatially distributed in series and a projection system configured to project and modulate radiation diffracted from the mark; scanning the substrate such that the plurality of illumination spots are incident on the mark sequentially, producing diffracted radiation from the plurality of illumination spots being diffracted by the mark; projecting the modulated radiation onto a detecting system configured to produce signals corresponding to each of the plurality of illumination spots, the signals being combined to determine the position of the mark.

The method may further comprise scanning the substrate at a constant speed with respect to the apparatus.

BRIEF DESCRIPTION OF THE DRAWINGS

Embodiments of the invention will now be described, by way of example only, with reference to the accompanying schematic drawings, in which:

FIG. 2 depicts a schematic block diagram of a known alignment sensor AS;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
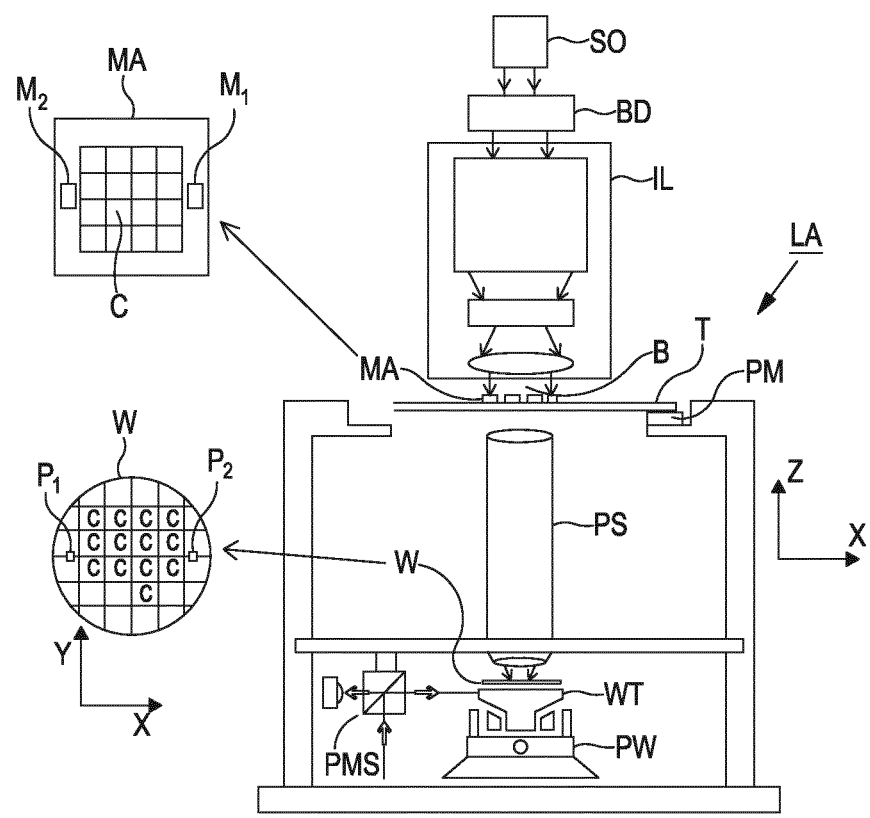
FIG. 1 depicts a schematic overview of a lithographic apparatus in accordance with an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
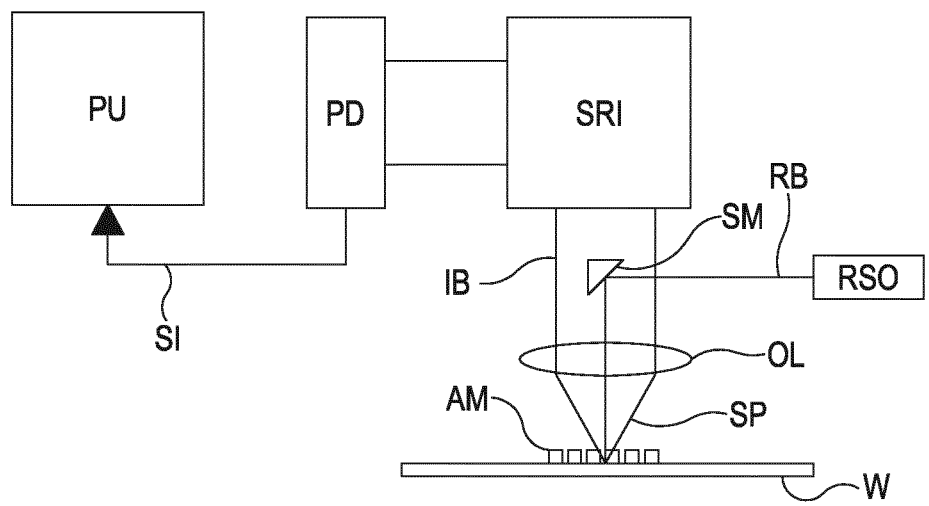

FIG. 2 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Figure 3:
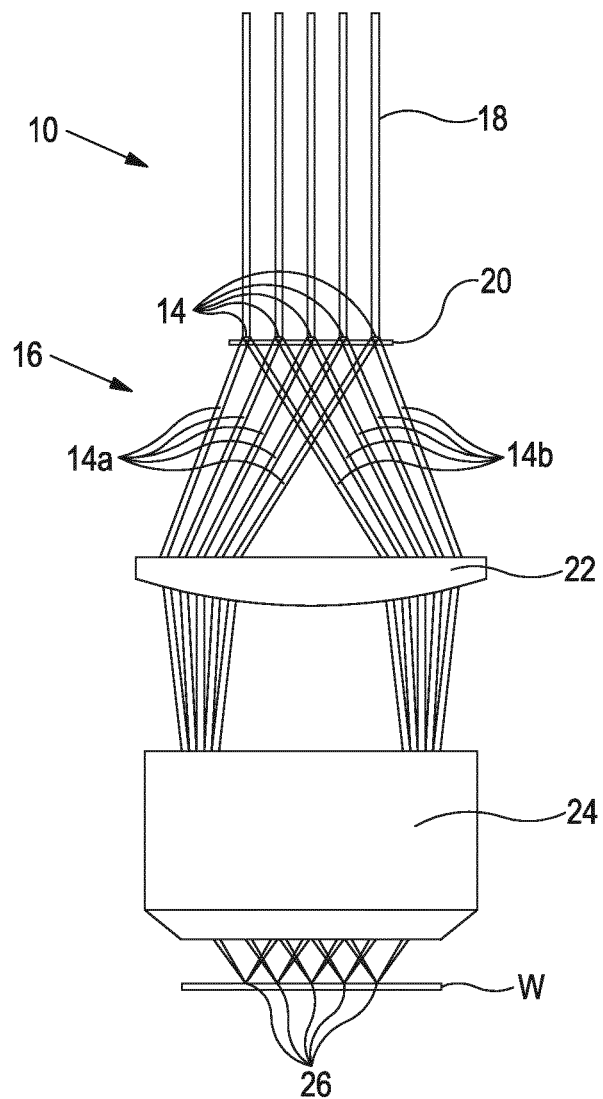
FIG. 3 depicts a schematic diagram of an alignment sensor in accordance with an embodiment of the invention.

FIG. 3 is a schematic diagram of an embodiment of an apparatus 10 for measuring the position of an alignment mark on the substrate W. The apparatus 10, which may be referred to as an alignment sensor, may in an embodiment be similar to the known alignment sensor AS shown in FIG. 2 with some differences, which will become apparent. In other embodiments the alignment sensor of the invention is similar to an image-based sensor with some differences, in which images of the alignment marks are analyzed to determine wafer alignment parameters.

Figure 4:
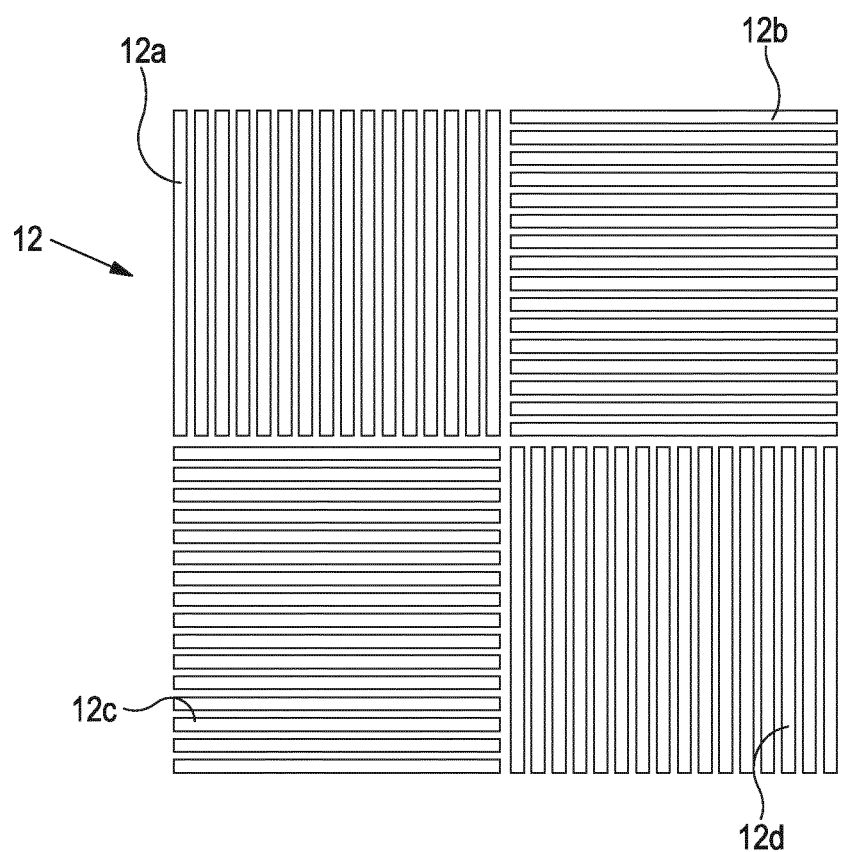
FIG. 4 depicts a schematic diagram of a micro diffraction based overlay (µDBO) mark in accordance with an embodiment of the invention.

The alignment marks may be periodic gratings. In some embodiments, the alignment marks may be for measuring overlay of substrates. The marks may be a μDBO (micro diffraction based overlay) mark 12 as shown in FIG. 4. The total size of the μDBO mark 12 may be e.g. 16×16 μm. The individual grating patches 12a-d would thus be e.g. 8×8 μm. Typical pitches of the μDBO mark 12 would be 500-1000 nm. In other embodiments the marks may be alignment marks such as e.g. traditional marks that are typically larger than overlay marks and have larger pitches than overlay marks. E.g. a typical size of a traditional mark might be 40×80 μm and a typical pitch might be between 1.6 and 3.2 μm. Some of the marks may have vertical or horizontal grating lines to measure either the x or y positions and other marks may have diagonal grating lines to measure both the x and y positions. It will be appreciated that in other embodiments, different types of marks may be used as long as they can be used to measure the position of the marks. In the remaining description, the μDBO mark will be used but it will be appreciated that any type of mark may be used in the embodiments described.

Referring to FIG. 3 once more, the apparatus 10 is a measurement apparatus. The apparatus 10 may be, or form part of, a metrology apparatus. A metrology apparatus is used to determine properties of the substrates W, and in particular, how properties of different substrates W vary or how properties associated with different layers of the same substrate W vary from layer to layer. The apparatus 10 may, for example, be integrated into the lithographic apparatus LA, or may be a stand-alone device. It will be appreciated that the apparatus may be located elsewhere in the lithographic apparatus LA and/or may be used for measuring different alignment marks located on different substrates.

A plurality of radiation beams 14 from a radiation source (not shown) are passed through the alignment sensor 10 to illuminate the alignment marks on the substrate W. In some embodiments, the radiation source may be part of the alignment sensor 10 and, in other embodiments, the radiation source may be a separate component. The radiation source may be a broadband radiation source, such as a supercontinuum source, and additional optics may provide for a suitable selection of one or more wavelength ranges or wavelengths. Alternatively a plurality of radiation sources are provided each emitting radiation in a different wavelength ranges (or partly overlapping wavelength ranges) to provide for the selection of one or more wavelength ranges or wavelengths.

The alignment sensor 10 comprises an illumination system 16 which is configured to direct the radiation beams 14 onto the alignment marks on the substrate W. The illumination system 16 comprises a 1D single mode fiber (SMF) array 18 through which the radiation beams 14 are passed. The radiation is transported from the radiation source to optical module through the single mode fibers. The radiation source(s) and/or detector(s) (which may heat up or vibrate) may be placed away (e.g. several meters away) from the (interferometrically stable) optical module and the substrate. Single mode fibers are used in this embodiment as spatially coherent radiation is used which is best transported by one spatial mode fiber. However, in other embodiments, spatially incoherent alignment sensors may be used which may use multimode fibers. It will be appreciated that in some embodiments the radiation may not be transported through fibers.

The illumination system 16 includes an illumination reference (phase) grating 20 which is used to split each of the radiation beams 14 into two large angle, off axis illumination beams 14a, 14b. The illumination beams 14a, 14b correspond to the $1^{st}$ and $-1^{st}$ orders of the illumination reference grating 20 (the $0^{th}$ order is absent for a perfect phase grating, or may be removed with a pupil stop).

In other embodiments, the use of a reference grating may not be required. For example, in other embodiments, there may be no reference grating and the illumination spot size on the substrate (at least in 1 dimension) may be decreased to approximately the grating pitch or half the grating pitch. Then, just as in the embodiment of FIG. 3, a periodic intensity signal would be detected on (e.g.) a photodiode. This signal could also be used to determine the alignment position, in a similar way to as will be described. An issue with this alternative embodiment is that a smaller spot is required on the substrate, thus reducing the number of photons that can be used without damaging the substrate. Less photons means a lower signal to noise ratio (SNR), i.e. lower (reproducibility) performance. As another example, each illumination spot on the substrate may have its own (miniaturized) alignment sensor, e.g. as described above, and thus would not require a reference grating. This may be more easily envisioned with respect to FIG. 6, where each illumination spot has its own lens. An additional example where a reference grating may not be required may be that each illumination spot may have its own miniaturized image-based sensor in which an image sensor, such as a CCD or CMOS sensor, is provided to detect one or more images of the alignment marks. These miniaturized alignment sensors could be integrated optics sensors. In U.S. Pat. No. 9,716,193 B2 an example of an integrated optics sensor is described. In the "Electro-optics handbook"/Ronald W. Waynant, editor, Marwood N. Ediger, editor.—2nd ed. (ISBN 0-07-068716-1 (hc), McGraw-Hill) it is explained that an optical integrated circuit (OIC) is a thin-film-type optical circuit designed to perform afunction by integrating a laser diode light source, functional components such as switches/modulators, interconnecting waveguides, and photodiode detectors, all on a single substrate. In par. 26.3.1 of that book the use of gratings as lenses is explained. Gratings can be used to guide light to the wafer and to get it back again on a sensor. In par. 26.4.4 it is explained how to get parallel multi-color light with wavelength (de-)multipliers. This technology can all be used to create integrated optics sensors which are small and many of them can be placed in parallel to create an array of alignment sensors so that many alignment marks can be measured in parallel.

In this embodiment, the illumination beams 14a, 14b are then focused by a plano-convex lens 22 of the illumination system 16 onto a large FOV (field of view) objective lens 24 which further focuses the illumination beams 14a, 14b onto the substrate W. The objective lens 24 focuses the corresponding illumination beams 14a, 14b originating from the same radiation beam 14 onto an illumination spot 26 on the substrate W. In this way, five illumination spots 26 are formed on the substrate W by the conditioning of each of the radiation beams 14 by the illumination system 16. There is one illumination spot 26 of radiation per individual single mode fiber of the SMF array 18. It will be appreciated that in other embodiments, different types of lenses may be used, e.g. the plano-convex lens may be a different lens.

As each of the radiation beams 14 are spatially distributed with respect to the other radiation beams 14 then the illumination spots 26 are also spatially distributed. In this embodiment, the illumination system 16 is configured to condition the radiation beams 14 to form five illumination spots 26 spatially distributed in series on the substrate W. In other embodiments a different number of illumination spots may be formed. It will be appreciated that this is only an example and that there are several ways in which a plurality of illumination spots may be formed. For example, the illumination system may be made up of a different number or type of optical components.

In this embodiment, the illumination system 16 directs the plurality of illumination spots 26 such that there are gaps/spacing between adjacent illumination spots 26. For example, the spacing between adjacent illumination spots on the substrate W may be e.g. 50 μm. The spacing between illumination spots may be the same or may be different.

In other embodiments, there may be no gaps between the illumination spots 26 on the substrate W. That is, the illumination spots 26 may be considered to form a continuous band or line of illumination (i.e. a long spot stretched in one direction) on the substrate W in this case. In some embodiments, the illumination spots may be overlapping to some extent with other illumination spots. In other embodiments, some of the illumination spots amongst the plurality of illumination spots on the substrate may have a gap to the adjacent illumination spot and other illumination spots may have no gap to the next illumination spot.

It will be appreciated that this "long spot" may also be produced from a single illumination spot, generated by e.g. a single illumination fiber and a cylindrical lens. The cylindrical lens may focus the radiation into a band or line instead of a point/spot. In other words, the illumination "long spot" may be considered to be an illumination band or line. That is, the illumination band may extend a distance in one direction longer than a distance in an orthogonal direction. Thus, assuming the longer distance is in the scan direction, the illumination band would be incident on the mark for a time that is longer than an illumination spot would be at the same scan speed. Furthermore, the radiation forming the illumination band may be at a greater intensity than would be allowed for an illumination spot to avoid damage to the substrate W. This is because the illumination band radiation would be more spatially spread out than the illumination spot. That is, more photons may be incident on the mark using one illumination band than one illumination spot. Thus, the illumination band may provide the same or similar benefits as the plurality of illumination spots as explained later, at least to a certain extent.

Figure 5:
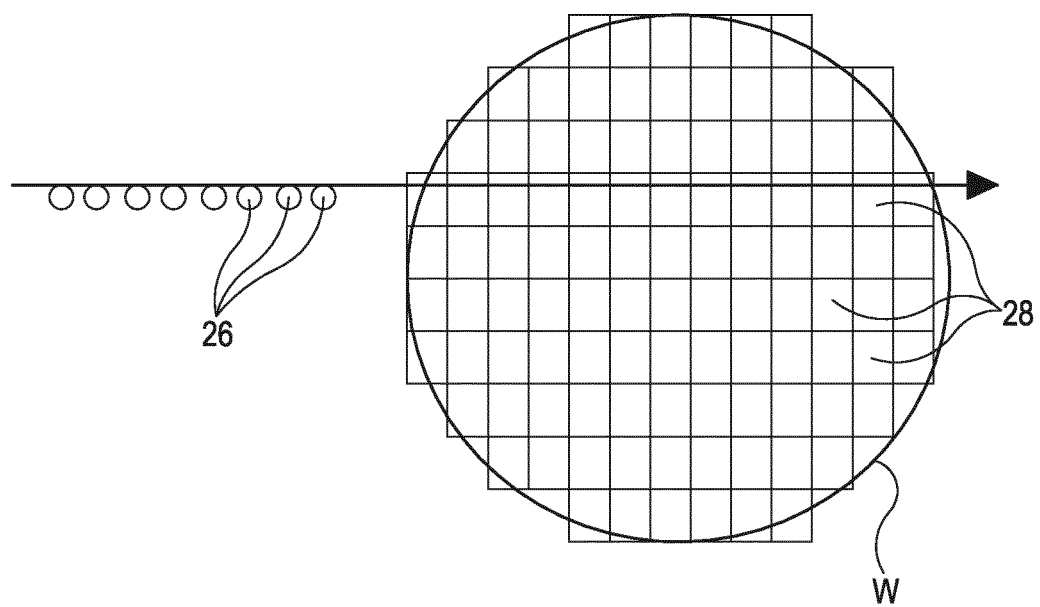
FIG. 5 depicts a schematic diagram of a substrate and a series of illumination spots produced by the alignment sensor in accordance with an embodiment of the invention.

FIG. 5 shows a schematic diagram of the illumination spots 26 before being incident on a substrate W. The substrate W has a plurality of fields 28 which may each include one or more marks. These marks may be μDBO marks 12 or other types of alignment marks.

It can be seen from FIG. 5 that the illumination spots 26 may have different sizes and shapes and may have differently sized spacings between adjacent illumination spots 26.

The substrate W is scanned, i.e. it is moved with respect to the alignment sensor 10 wherein the radiation is incident on the substrate W and moves across the substrate W. The arrow shows the direction of movement of the illumination spots 26 with respect to the substrate W. The plurality of illumination spots 26, which are spatially distributed in series, are incident on the substrate W sequentially when the substrate W is scanned.

The substrate may be scanned in a zig-zag motion (back-and-forth) motion, in which the scan of another (next) row of fields occurs in an opposite direction. The substrate may be scanned in a grid motion, e.g. left-right as well as up-down. The illumination spots of the alignment sensor may be distributed in a cross-like shape, e.g. not only a horizontal sequence but also a vertical sequence. The substrate may be scanned diagonally, to obtain x and y information from a single scan over a μDBO mark. Parallel sensors could be used, in which each alignment sensor contains a row of illumination spots. This would enable measuring of the full substrate in a single linear scan motion over the substrate.

Thus, the illumination spots 26 distributed in series are incident sequentially on the μDBO marks 12 on the substrate W which lie in the path of the radiation across the substrate W. That is, each of the illumination spots 26 will fall upon the μDBO mark 12 one after another as the substrate W is scanned. If more than one μDBO mark 12 lies in the path of the radiation as it crosses the substrate W then each μDBO mark 12 will also be illuminated with each of the illumination spots 26 one after another. In some embodiments, the illumination system 16 may be configured such that only one of the illumination spots 26 is incident on the mark simultaneously. That is, the size of the illumination spot is typically in the order of the size of the mark and the gap between adjacent illumination spots 26 is equal to or larger than the size (e.g. width) of the μDBO mark 12. In other embodiments, more than one of the illumination spots 26 may be incident on the μDBO mark 12 at the same time.

The illumination spots 26 are diffracted from the μDBO mark 12 and then the diffracted radiation is detected to determine the position of the μDBO mark 12. The projection and the detection of the diffracted radiation may be carried out in any suitable way and some embodiments are described in relation to FIGS. 7-9. Although only the illumination system 16 of the alignment sensor 10 has been specifically described in relation to FIG. 3, it will be appreciated that in other embodiments the alignment sensor 10 may include one or more of a projection system, a detecting system, a radiation source and other optical components as required to carry out the function of illuminating a mark and measuring the position of the mark. In an embodiment, the detection system is equal to the projection system, i.e. the radiation beams that are diffracted by the target interfere on the reference grating. The intensity coupled back into the single-mode fiber (in this case a shared illumination and detection fiber) then oscillates periodically while scanning over the mark, enabling determination of the alignment position.

The size of the illumination spots 26 may be varied depending on the particular marks that are having their positions measured. As mentioned above, the individual grating patches of the μDBO marks 12 may have a size of 8×8 μm. For example, the spot size (diameter) may be 6 μm for μDBO marks 12. However, the spot size may be different from this size. Typically it may be beneficial to slightly underfill a mark so as to be insensitive to surrounding structures. For square shaped marks it may also be beneficial to make the spot a bit smaller than the mark, so that there is some room to scan over the mark without hitting surrounding structures. Typical alignment marks may have a size of 40×80 μm. For typical alignment marks, the spot size may be 40 μm. The number of the illumination spots 26 used may also vary depending on the marks being used. For example, the number of spots may be 40 for μDBO marks 12. For typical alignment marks, the number of spots may be 10. Generally, more illumination spots may be needed to achieve the same alignment performance on smaller marks as on larger marks. It will be appreciated that in other embodiments, the size and numbers of the illumination spots may be different.

The speed of the scan may be 1 m/s. The scan speed may be substantially constant across the whole substrate W. That is, the speed may not be reduced when the illumination spot 26 is on the μDBO marks 12. Thus, the scan of the substrate W by the alignment sensor 10 may be considered to be a fast/high speed scan when compared to other systems where the scan must be slowed down when the illumination spot is incident on the mark. In other systems the scan speed may be reduced in order to achieve sufficiently good reproducibility (i.e. the variation in measuring the positions of the same mark at different times). If the position of the same mark is measured many times, then the 'reproducibility' is defined as 3 times the standard deviation of the position distribution. Reproducibility may be considered to be 'good' when it is below a certain value, for example 0.1 nm or 1 nm.

It will be appreciated that in other embodiments, the scan speed may not be constant over the whole substrate and may be decreased or increased. However, generally the overall scan speed using the alignment sensor 10 will be higher than other systems whilst still providing sufficiently good reproducibility.

In some embodiments, due to the relatively small size of the μDBO mark 12, several of the μDBO marks 12 may be placed inside each field 28 on the substrate W. For example, 5 or 7 or 9 of them could be placed in a row (distributed over the area below the exposure slit of the lithographic apparatus LA). If there are e.g. 10 fields 28 next to each other on the substrate W and each field contains 7 μDBO marks 12 next to each other, then 70 μDBO marks 12 can be measured in a single pass over the substrate W (which would take e.g. 300 msec at a speed of 1 m/s).

Using the alignment sensor 10 at the 1 m/s scan speed and the 6 μm spot size for μDBO marks 12, the scan length may be 3 μm. Thus, the duration that the illumination spot 26 is incident on each μDBO marks 12 is 3 μs. More particularly, this is the total time the illumination spot 26 is (almost) completely on the μDBO mark 12. This is assuming that it is not desired to use part of the measurement where a large part of the spot hits surrounding structures. This may also not be a strict requirement though. Scan length is the distance travelled over the substrate W while measuring (with that same illumination spot). At the 1 m/s scan speed and the 40μm spot size for typical alignment marks, the scan length may be 40 μm. Thus, the duration that the illumination spot 26 is incident (completely) on each typical 80 μm alignment mark is 40 μs. This is assuming that it is not desired to use the signal when the spot is e.g. only half on the mark.

An advantage of having the illumination spots 26 in series such that they illuminate the μDBO mark 12 sequentially is that the total timeframe of the mark scan, i.e. starting when the first illumination spot 26 hits the μDBO mark 12 and ending when the last illumination spot 26 leaves the μDBO mark 12, is typically much longer than the timeframe of e.g. a 1 m/s scan with 1 spot. Therefore, machine dynamics get averaged out which alleviates the reproducibility impact of machine dynamics. The machine dynamics may be vibrations, servo errors etc. in the machine which may not average out when the mark is measured for only a short time. Thus, in other systems, the scan speed needs to be decreased over the mark to achieve good reproducibility, which leads to an increase in overall time for the alignment.

Another advantage of having the illumination spots 26 in series such that they illuminate the μDBO mark 12 sequentially is that the total number of photons that are incident on, and are diffracted from, the μDBO mark 12 is increased when compared to e.g. 1 spot being incident on a mark at the same scan speed. Therefore, enough photons can be measured such that good reproducibility is achieved. In other systems, when the mark is measured for a very short time, there are not enough photons to achieve good reproducibility (even in the case of photon shot-noise limited detection).

Thus, this is another reason why in other systems, the scan speed needs to be slowed down over the mark to achieve good reproducibility, which leads to an increase in overall time for the alignment.

In other systems having only a single illumination spot which is not in series with other illumination spots, the speed of the scan may be 1 m/s between alignment marks. The speed may be e.g. 11 mm/s over the alignment marks in order to get sufficiently good reproducibility. If the scan speed was increased over the marks then there would be less light being diffracted and the signal to noise ratio would be worse. Furthermore, vibrations which were occurring with a period shorter than e.g. 1 ms (i.e. typical scan duration at 11 mm/s scan speed) may average out but any vibrations with a period having a longer timescale than that may not average out and could thus affect the accuracy of the measurement of the position of the mark. As an example, if a spot was being illuminated for only 10 µs e.g. because the scan speed is 1 m/s instead of the usual 11 mm/s, then there may be alignment errors due to any vibrations occurring over a timescale between e.g. 10 µs and 1 ms.

The alignment sensor 10 uses a plurality of illumination spots 26 (e.g. 10-100 spots) in series which illuminate the µDBO mark 12 one after each other. Using the alignment sensor 10 may enable vibrations having timescales of between e.g. 10 µs and 1 ms to average out. This is because the total time that the µDBO mark 12 is illuminated by all the illumination spots 26 is in the order of ms rather than µs.

The more illumination spots 26 used and the more densely spaced the illumination spots 26 (i.e. having smaller gaps between adjacent spots), the better. However, having a continuous line of illumination spots 26 (i.e. with no gaps between adjacent spots) may be more difficult to achieve technically than having illumination spots 26 with some spacing between them.

A first important aspect is the time between when the first illumination spot 26 measures the µDBO mark 12 and the last illumination spot 26 measures the µDBO mark 12. This may be called the total measurement time. The total measurement time must be long to be able to average out vibrations at long timescales.

A second important aspect is that there should be a sufficient amount of illumination spots 26 between the first and last illumination spots 26. This is in order to suppress the vibrations in this range of timescales. An example to illustrate this is as follows. Assume there are only 2 small illumination spots 26 with a large spacing between them. In that case a vibration at the timescale (frequency) that exactly matches the spacing would not average out, because a vibration at this frequency might e.g. induce a positive alignment error when the 2 illumination spots measure the mark and a negative error in between (which is, in this case, not measured, since there is no measurement spot). Illumination spots in between would suppress this kind of higher order frequencies. The more illumination spots in between the first and last illumination spots 26, the better this higher order suppression will be.

Figure 6:
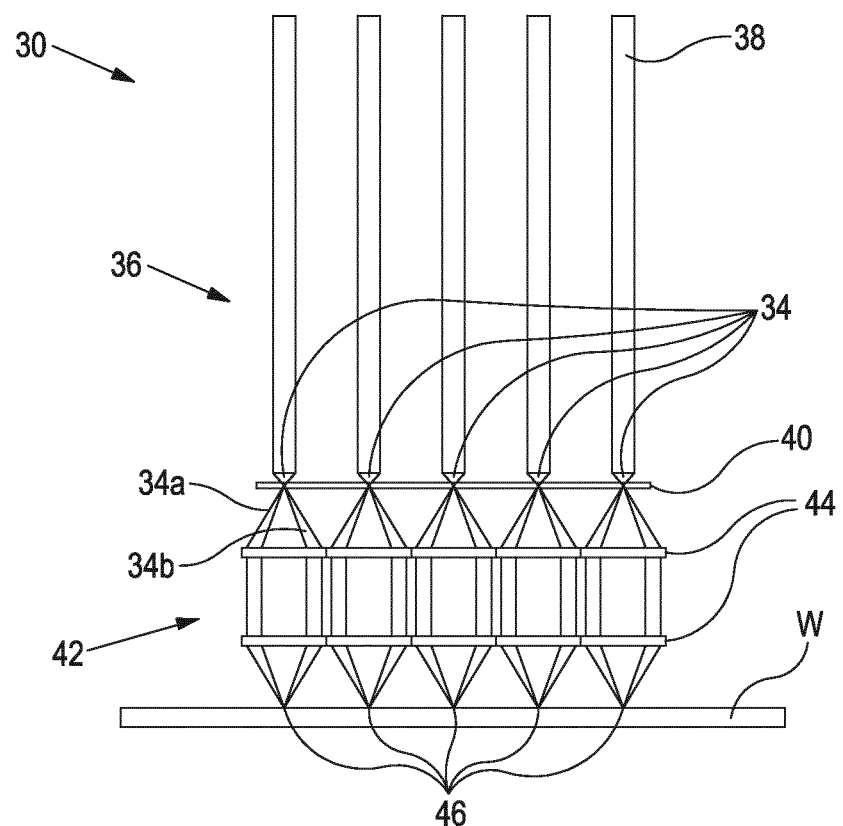
FIG. 6 depicts a schematic diagram of an alignment sensor in accordance with an embodiment of the invention.

FIG. 6 shows another embodiment of the measurement apparatus which is an alignment sensor 30. The alignment sensor 30 is similar to the alignment sensor 10 shown in FIG. 3 but has some different optical components as will be described.

The alignment sensor 30 conditions five radiation beams 34 using an illumination system 36. The illumination system 36 is configured to direct the radiation beams 34 onto the µDBO marks 12 (or other alignment marks) on the substrate W. The illumination system 36 comprises a 1D single mode fiber (SMF) array 38 through which the radiation beams 34 are passed.

The illumination system 36 includes an illumination reference (phase) grating 40 which is used to split each of the radiation beams 34 into two large angle, off axis illumination beams 34a, 34b. In this embodiment, there is one (large) grating for all the illumination spots 46. In other embodiments, there may a separate grating for each corresponding single mode fiber.

The illumination beams 34a, 34b enter a micro lens array 42 which focuses the illumination beams 34a, 34b onto the substrate W. Micro lenses 44 of the micro lens array 42 focuses the corresponding illumination beams 34a, 34b originating from the same radiation beam 14 onto an illumination spot 46 on the substrate W. In this way, five illumination spots 46 are formed on the substrate W in series by the conditioning of each of the radiation beams 34 by the illumination system 36. There is one illumination spot 46 of radiation per individual single mode fiber of the SMF array 38.

The illumination spots 46 formed by the alignment sensor 30 are similar to the illumination spots 26 formed by alignment sensor 10 of FIG. 3 and will not be described further in detail. That is, the illumination system 36 of the alignment sensor 30 conditions radiation beams 34 to form five illumination spots 46 spatially distributed in series such that during scanning of the substrate W the illumination spots 46 are incident on the µDBO mark or marks 12 sequentially. The alignment sensor 30 provides the same or similar advantages to the alignment sensor 10.

It will be appreciated that in some embodiments, multiple radiation sources may be used. For example, one radiation source and one detector per illumination spot on the substrate. In other embodiments, only one light source and one detector are required to address all spots on the wafer. An example of such an embodiment is shown in FIG. 7.

Figure 7:
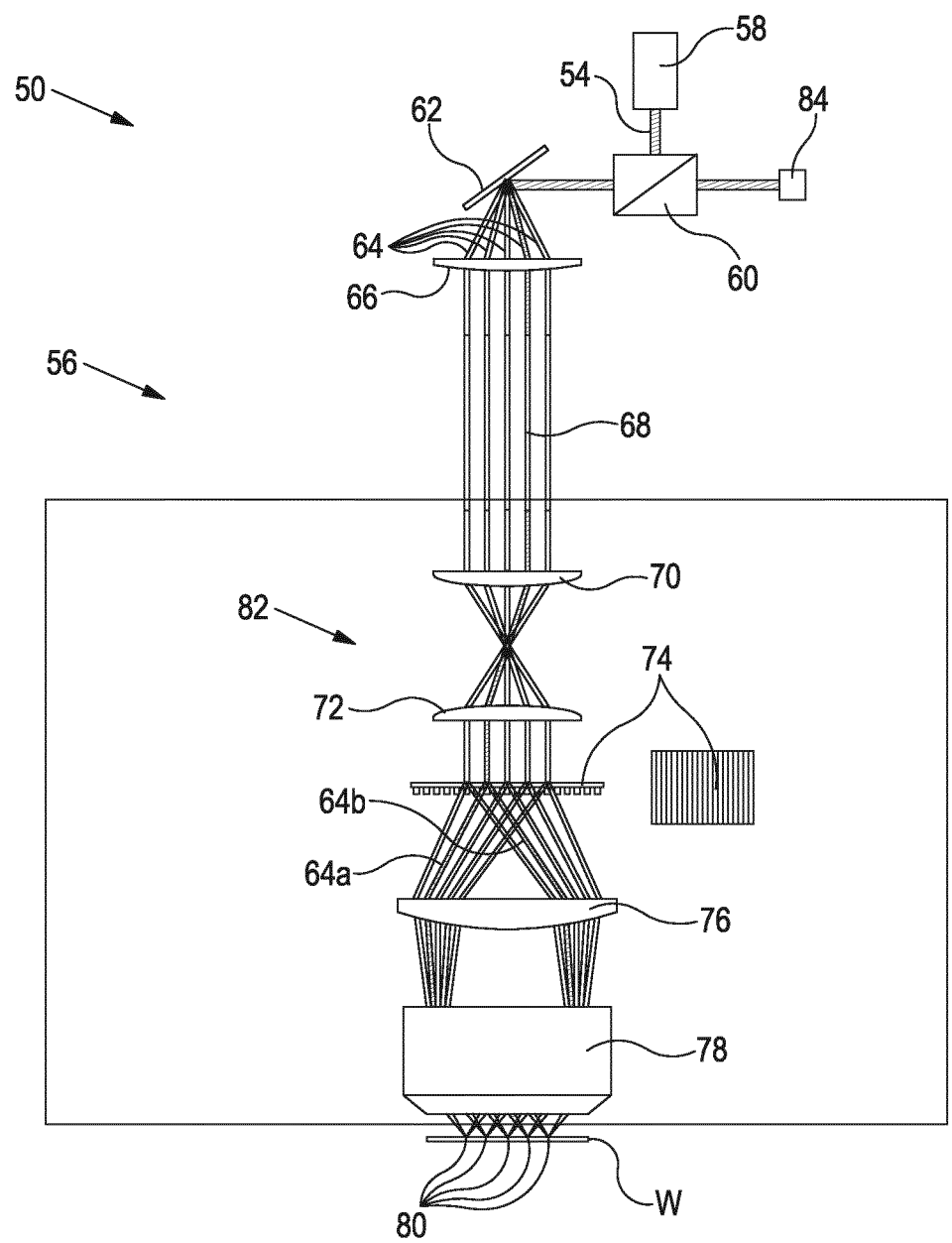
FIG. 7 depicts a schematic diagram of an alignment sensor in accordance with an embodiment of the invention.

FIG. 7 shows another embodiment of the measurement apparatus which is an alignment sensor 50. The alignment sensor 50 is similar to the alignment sensor 10 shown in FIG. 3 but has some different optical components as will be described. It will be appreciated that the components of the alignment sensor 10 may be used in the alignment sensor 50. In some embodiments, it may be considered that the alignment sensor 50 comprises the alignment sensor 10 or that the alignment sensor 10 forms part of the alignment sensor 50.

The alignment sensor 50 conditions an input radiation beam 54 using an illumination system 56. The input radiation beam 54 is produced by a radiation source 58. In this embodiment, the radiation source 58 forms part of the alignment sensor 50 but, in other embodiments, the radiation source 58 may be a separate component.

The input radiation beam 54 passes through a beam splitter 60 which directs the input radiation beam 54 onto a rotatable (more generally a moveable) mirror 62. In this embodiment, only one illumination spot (e.g. corresponding to one fiber of the single mode fiber (SMF) array) is above the mark. The mirror 62 (or other switching element) is used to, at each time, only address the single mode fiber that is above the mark at that time. That is, in use, the mirror 62 is rotated such that the input radiation beam 54 is only passing through one of the fibers at a time. These radiation beams passing through the SMF array are referred to here as radiation beams 64. The radiation beams 64 are analogous to the radiation beams 14 of FIG. 3. A darker line shows the path of one of the radiation beams 64 through the alignment sensor 50 from the radiation source 58 to the µDBO mark 12 on the substrate W and back to be detected.

The radiation beams 64 are focused by a first plano-convex lens 66 of the illumination system 56 such that each radiation beam 64 is projected into corresponding individual single mode fibers of a single mode fiber (SMF) array 68. Following exit from the SMF array 68, the radiation beams 64 are focused by a second plano-convex lens 70 and then collimated once more by a third plano-convex lens 72 to be incident on a reference grating 74. It will be appreciated that alternative configurations with e.g. fiber collimators could also be used.

The reference grating 74 is both an illumination and detection reference phase grating as will be explained. The illumination reference grating 74 is used to split each of the illumination radiation beams 64 into two illumination beams 64a, 64b in a similar way as described with respect to FIG. 3. The reference grating 74 matches the µDBO mark 12. In this embodiment, the reference grating 74 is one (large) grating but in other embodiments, a plurality of separate gratings may be used (e.g. one for each radiation beam 64).

The illumination beams 64, 64b are then focused by a fourth plano-convex lens 76 of the illumination system 56 onto a large FOV (field of view) objective lens 78 which further focuses the illumination beams 64a, 64b onto the substrate W. The objective lens 78 focuses the corresponding illumination beams 64a, 64b originating from the same radiation beam 64 onto an illumination spot 80 on the substrate W. In this way, five illumination spots 80 are formed on the substrate W by the conditioning of input radiation beam 54 (and each of the radiation beams 64) by the illumination system 56. There is one illumination spot 80 of radiation per individual single mode fiber of the SMF array 68.

The illumination spots 80 formed by the alignment sensor 30 are similar to the illumination spots 26 formed by alignment sensor 10 of FIG. 3 and so will not be described further in detail. That is, the illumination system 56 of the alignment sensor 50 conditions radiation beams 64 to form five illumination spots 80 spatially distributed in series such that during scanning of the substrate W the illumination spots 80 are incident on the µDBO mark or marks 12 sequentially. The alignment sensor 50 provides the same or similar advantages to the alignment sensor 10.

Once the illumination spots 80 are incident on the µDBO mark 12, the radiation is diffracted from the µDBO mark 12. The alignment sensor 50 includes a projection system 82 which is configured to project the diffracted radiation from the µDBO mark 12. The diffracted radiation may be considered to be images of the µDBO mark 12.

In this embodiment, the projection system 82 components are the same as the illumination system 56 components but the diffracted radiation travels in the opposite direction. It can be seen from the darker line showing the path of one of the radiation beams 64 that the diffracted beam follows the same path back towards the radiation source. The pitch of the reference grating 74 is typically matched to the pitch of the target grating (i.e. the µDBO mark 12) to enable this. The pitch of the reference grating 74 may e.g. be 2 times the pitch of the target grating (µDBO mark 12) when not taking into account the magnification of plano-convex lens 76 and objective lens 78. However, once the diffracted beam reaches the beam splitter 60, it is passed through the beam splitter 60 to be incident on a detecting system 84. The alignment sensor 50 uses homodyne interferometric amplification, i.e. it is brightfield. That is, the collected $0^{th}$, $-1^{st}$ and $+1^{st}$ orders can all be taken into account to interfere on e.g. the detection reference grating 74 or inside the single mode fiber. While scanning over the substrate W, the radiation beams will alternate between constructive and destructive interference and therefore result in an oscillating alignment signal on the detecting system 84. In other embodiments, the projection system 82 may have different components from the illumination system 56 or may only share one or more of the components.

The detection reference grating 74 modulates the diffracted radiation so that the detecting system 84 may produce signals to determine the position of the µDBO mark 12. More generally, the projection system 82 is configured to modulate the diffracted radiation and project the modulated radiation onto the detecting system 84. The modulated diffracted radiation may be considered to be modulated images of the µDBO mark 12. The detecting system 84 is configured to produce signals corresponding to each of the plurality of illumination spots 80, the signals being combined to determine the position of the µDBO mark 12. In other embodiments, the components of the projection system 82 may be different as long as they provide the necessary function. For example, the modulation may be carried out by an optical block which may be e.g. a self-referencing interferometer.

The detecting system 84 may be referred to as a sensor. The sensor may be an intensity sensor. In this embodiment, the detecting system 84 is a photodiode sensor but it will be appreciated that in other embodiments the detecting system 84 may be a different type of sensor, such as a CCD or CMOS sensor.

As previously mentioned, the illumination beams radiation beams 64a, 64b are diffracted from the µDBO mark 12 to produce the images of the µDBO mark 12. During the scanning of the substrate W, the illumination spots 80 move over the µDBO mark 12 which produces a periodic intensity change in the modulated images of the µDBO mark 12, when viewed by the detecting system 84. In this embodiment, the modulated images cannot reach detecting system 84 due to the single mode fiber (SMF). This is because only a (fluctuating) intensity can be transmitted through a SMF; spatial information cannot be transmitted. One way to view it is that an image of the µDBO mark 12 will be formed on top of the detection reference grating 74. While scanning over the substrate W, the µDBO mark 12 image will move over the detection reference grating 74. As a result, the intensity that is coupled into and transmitted through the SMF fluctuates while scanning over the µDBO mark 12. The scan of the µDBO mark 12 with respect to the alignment sensor 50 leads to the periodic intensity change from zero to maximal intensity (after modulation of the image of the µDBO mark 12). This process is described in more detail above with reference to FIG. 2. It will be appreciated that this may occur for more than one µDBO mark 12.

A periodic electrical signal is produced from the modulated image of one of the µDBO mark 12 on the detecting system 84. The magnitude of the modulated image electrical signal changes from a maximum to a minimum during the scan of the µDBO mark 12. There will be separate similar periodic electrical signals for each of the plurality of the µDBO marks 12. For example, the signal may be a sine wave in the case of single order usage for the image of the alignment mark (e.g. $1^{st}$ or $3^{rd}$ order etc.) In other embodiments, the shape of the electrical signal may be different (while still changing from a maximum and minimum over the scan of the alignment mark). In other embodiments, the whole pupil may be used and thus the signal shape may be triangular.

The signals (which are intensity signals) are supplied to a processing unit (not shown). The processing unit computationally processes the signals and outputs the position of the μDBO marks 12. The processing unit may output values for X- and Y-position on the substrate W relative to a reference frame. The position of the μDBO marks 12 may be provided with reference to the substrate W.

Once the positions of the μDBO marks 12 have been determined (i.e. measured by the alignment sensor 50), the aligned positions of the μDBO marks 12 may be used to e.g. measure overlay or, in other embodiments, the aligned position of the measurement of the alignment marks may be used to position patterns (layers) on the substrate W with respect to each other. The processing unit may be used to align the μDBO marks 12. To align patterns on a substrate W, more than one alignment mark is required.

The mirror 62 may be scanned (rotated) so that each of the diffracted radiation beams produced by the diffraction from the illumination beams 80 from the μDBO marks 12 may be incident on the detecting system 84. The mirror 62 transmits the illumination radiation into the fiber (SMF) underneath which the μDBO mark 12 is currently located. All the detected radiation comes from the same fiber (because it comes from the same location on the substrate W), so the mirror 62 angle is already correctly set to send the collected radiation to the detecting system 84. This means that requiring the use of multiple detectors may be avoided. However, it will be appreciated that, in some embodiments, multiple detectors may be used. For example, there may be separate detectors for each of the illumination spots 80 that are formed. That is, separate detectors for each of the radiation beams 64.

In some embodiments, the moveable mirror 62 is not required, i.e. it is replaced with a fixed mirror. That is advantageous as the removal of a moving optical component reduces machine vibrations and lessons the risk of failure of components. It is possible to illuminate all fibers of a SMF array and to integrate the radiation from all fibers onto one detecting system. A problem may arise in that there may be signal from the illumination spots that hit structures other than the mark that is to be measured. In this case, it is desired to have some mechanism to separate signal(s) originating from a mark and signal(s) not originating from a mark, i.e. from everything else. In case only one detector is present, then radiation coming from 'undesired' spots/fibers may need to be blocked, e.g. with a scan mirror or with separate (electro-optical or acousto-optical etc) shutters for each fiber. Alternatively, a shutter or switch could be used only in the illumination (because when a fiber/spot is not illuminated, then there can also not be radiation detected from that fiber).

As the substrate W is scanned, the illumination spots 80 move over the μDBO mark 12 sequentially such that signals for each of the illumination spots 80 are produced on the detecting system 84.

In one embodiment, the detecting system 84 is configured to produce signals such that provisional positions of the μDBO mark 12 is determined for each of the illumination spots 80. The provisional positions of the μDBO mark 12 is determined for each of the illumination spots 80 are then combined (e.g. in the processing unit) to produce the position of the μDBO mark 12.

That is, a first signal is produced from the detecting system 84 based on the radiation diffracted from the μDBO mark 12 from one of the illumination spots 80 (a first illumination spot 80). This signal is used to determine a first provisional position for the μDBO mark 12 for the first illumination spot 80. The scan of the substrate W is continued and the next illumination spot 80 (a second illumination spot 80 adjacent to the first illumination spot 80) is then incident on the μDBO mark 12. A second signal is then produced from the detecting system 84 based on the radiation diffracted from the μDBO mark 12 from the second illumination spot 80. This second signal is used to determine a second provisional position for the μDBO mark 12 for the second illumination spot 80. This is continued for each of the five illumination spots 80.

Next, each of the five provisional positions of the μDBO mark 12 are combined to produce the position of the μDBO mark 12. This may be a simple average of the position or may be through more sophisticated calculation. The signals may be processed or filtered. In this way, the position of the mark can average out any variations in the position due to the machine dynamics and also enough photons have contributed to the result to achieve a sufficient level of reproducibility.

In other embodiments, the detecting system 84 may be configured to produce signals to be combined into a combined signal which is used to produce the position of the μDBO mark 12. That is, the detecting system 84 produces signals for all of the illumination spots 80 as the substrate W is scanned. These signals are all combined into a one combined signal. This combined signal is then used (e.g. by the processing unit) to produce the position of the μDBO mark 12. In other words, the sinusoidal signals may be 'stitched together' to produce a long sinusoidal signal and that long sinusoidal signal may be processed or filtered to produce the position of the μDBO mark 12 with a good reproducibility.

Figure 8:
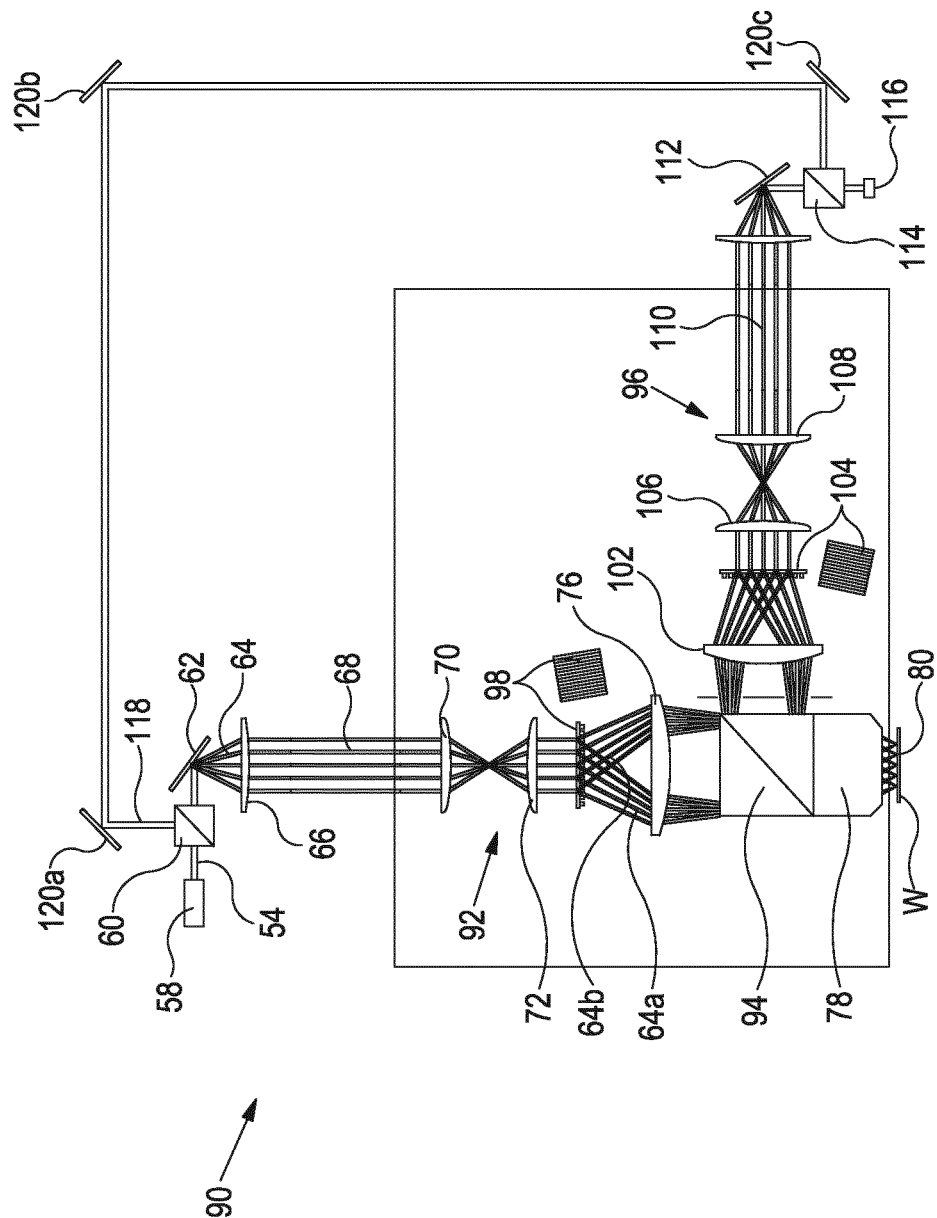
FIG. 8 depicts a schematic diagram of an alignment sensor in accordance with an embodiment of the invention.

FIG. 8 shows another embodiment of the measurement apparatus which is an alignment sensor 90. The alignment sensor 90 is similar to the alignment sensor 50 shown in FIG. 7 but uses interferometric amplification with an external reference rather than homodyne interferometric amplification. That is, alignment sensor 90 is darkfield. Many of the optical components of the alignment sensor 90 are the same as the optical components of the alignment sensor 50 and the same reference numerals will be used for these and they will not be described further. In FIG. 8 only one of the radiation beams 64 and only one of the illumination spots 80 is labeled but it will be appreciated that there are a plurality of radiation beams 64 and a plurality of illumination spots 80 as in FIG. 7.

The illumination spots 80 formed by the alignment sensor 90 are similar to the illumination spots 26 formed by alignment sensor 10 of FIG. 3 and will not be described further in detail. That is, the illumination system 56 of the alignment sensor 50 conditions radiation beams 64 to form five illumination spots 80 spatially distributed in series such that during scanning of the substrate W the illumination spots 80 are incident on the μDBO mark or marks 12 sequentially. The alignment sensor 90 provides the same or similar advantages to the alignment sensor 10.

The illumination system 92 is similar to the illumination system 56 in FIG. 7 but it includes a projection beam splitter 94 which is used to direct the diffracted radiation into a projection system 96. Thus, the diffracted radiation does not travel back through the same optical components that make up the illumination system 92. Furthermore, a reference grating 98 in the illumination system 92 is only an illumination reference phase grating as will be explained. The illumination reference grating 98 is used to split each of the illumination radiation beams 64 into two illumination beams

64a, 64b in a similar way as described in FIG. 7. The illumination reference grating 98 matches the μDBO mark 12.

The projection system 96 is similar to the projection system 82 of FIG. 7 and so the optical components will not be described in detail. The diffracted radiation beam is passed through the projection beam splitter 94 and then a first projection plano-convex lens 102, a detection reference grating 104, a second projection plano-convex lens 106, a third projection plano-convex lens 108, a single mode fiber of a single mode fiber array 110, a movable projection mirror 112, and a second projection beam splitter 114 before being incident on a detecting system 116.

The beam splitter 60 splits the radiation beam 54 from the radiation source 58 into a reference beam 118 and the radiation beam (which is split into the plurality of radiation beams 54) which travels through the rest of the illumination system 92. The reference beam 118 is reflected by three fixed mirrors 120a-c into the second projection beam splitter 114. In the second projection beam splitter 114, the reference beam is combined with the modulated diffracted beam from the illumination spots 80 that has passed through the projection system 96. The combined radiation beam is then incident on the detecting system 116 which produces the signals that may be used to determine the position of the μDBO mark 12.

Figure 9:
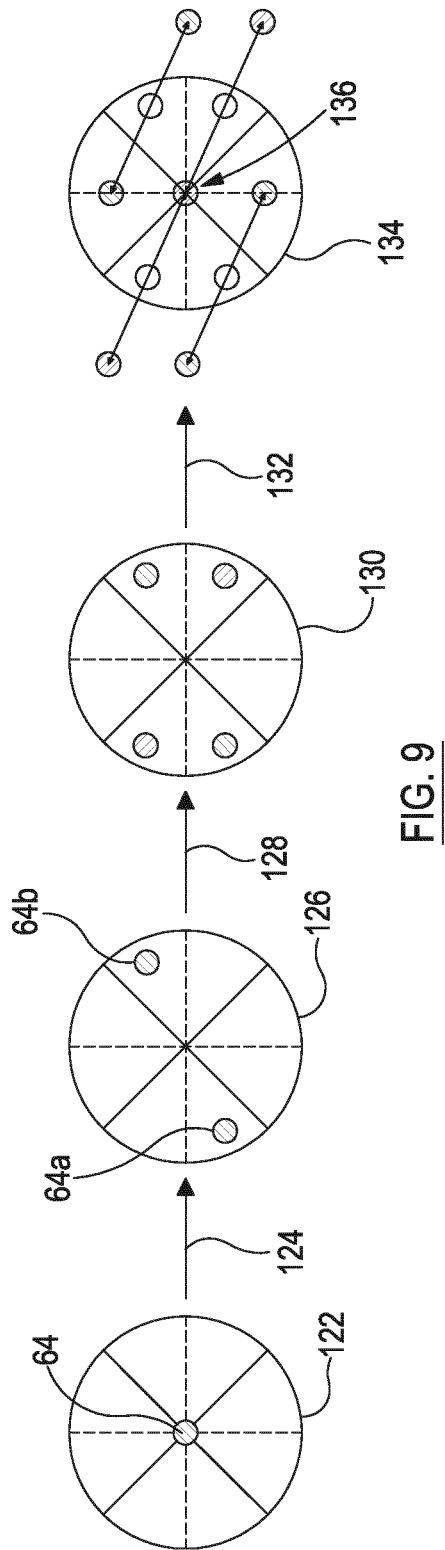
FIG. 9 depicts a schematic diagram of pupil planes in an alignment sensor in accordance with an embodiment of the invention.

The darkfield embodiment is described further with reference to FIG. 9. An individual spot on the substrate W corresponds to an individual single mode fiber (SMF) of the single mode fiber (SMF) array 68. The mode profile of the SMF in pupil plane 122 is the leftmost circle in FIG. 9. The illumination reference (phase) grating 98 (illustrated by first arrow 124) is used to split the illumination into 2 (large angle, off-axis) illumination beams 64a, 64b, corresponding to the $1^{st}$ and $-1^{st}$ orders of the illumination reference grating 98 (the $0^{th}$ order is absent for a perfect phase grating, or removed with a pupil stop). The illumination pupil 126 shows these two illumination beams 64a, 64b.

After interaction with the alignment grating (the illumination reference grating 98) (illustrated by second arrow 128), the $0^{th}$ order reflections of the illumination beams are captured as well as a $-1^{st}$ and $+1^{st}$ diffraction order. Due to the e.g. 22.5 degree angle of the illumination reference grating 98, the $-1^{st}$ and $1^{st}$ diffraction orders are separated from the $0^{th}$ orders in the detection pupil 130. Optionally, a pupil stop could be used to remove these orders (but this is not necessary).

The detection reference grating 104 (under e.g. −22.5 degree angle) maps the $-1^{st}$ and $1^{st}$ diffraction orders onto each other and lets them interfere with each other in the center of the pupil. The interaction with the detection reference phase grating 104 is illustrated by arrow 132. These interfering orders are captured by the detection fiber and cause an (oscillating) alignment signal with optimal contrast. The $0^{th}$ orders are not captured by the detection fiber (therefore we call it "darkfield"). The detection pupil at the detection fiber 134 is the rightmost circle in FIG. 9. The mode profile 136 captured by detection single mode fiber is also shown.

Once the diffracted beam is incident on the detecting system 116, signals are produced which may be used in a similar way to as described above in relation to FIG. 7 in order to determine the position of the μDBO mark 12.

Several embodiments of alignment sensors or optical components of alignment sensors have been described above but it will be appreciated that the method of e.g. producing a series of illumination spots and/or determining the position of alignment marks may be carried out in many ways using a variety of optical setups. The method of scanning fast with a series of spots/sensors would also work with many other sensor embodiments, such as a series of very small alignment sensors or simply a series of ~1 micrometer spots on the substrate W (e.g. similar to the brightfield embodiment but with a smaller spot on the substrate W and without any grating inside the sensor).

Although the above description has been focused on determining the position of one of the μDBO marks 12, it will be appreciated that the positions of a plurality of μDBO marks 12 may be determined using the methods described.

In some embodiments, the apparatus (alignment sensor) may be suitable for measuring the positions of a plurality of alignment marks. The illumination system may be configured such that when one of the plurality of illumination spots is incident on the mark, another of the plurality of illumination spots is incident on a further mark such that the position of the further mark may also be determined. Thus, in this case, parallel alignment of the alignment marks may be carried out. In some embodiments, the mark and the further mark are in the same path in the scan direction (y direction) but it will be appreciated that they may be in different parallel paths in the scan direction (y direction).

It will be appreciated that parallel alignment may also be carried out by a plurality of alignment sensors in parallel on a mark and an additional mark. In some embodiments, the mark and the additional mark may be in different parallel paths in the scan direction (y direction) but in other embodiments they may be in the same path in the scan direction (y direction).

As an example, the apparatus (alignment sensor) as described in one of the embodiments above may be configured to determine the position of a mark or marks as described above. There may also be additional apparatus (an additional alignment sensor) which is configured to determine the position of the additional mark or additional marks. The additional alignment sensor may be substantially the same or similar to the alignment sensor. In general, the alignment sensor and the additional alignment sensor together may be considered to be a measurement system for measuring positions of marks on a substrate.

The additional alignment sensor (additional apparatus) may comprise an additional illumination system configured to condition at least one additional radiation beam to form a plurality of additional illumination spots spatially distributed in series such that during scanning of the substrate the plurality of additional illumination spots are incident on an additional mark sequentially. The additional alignment sensor may include an additional projection system configured to project radiation diffracted by the additional mark from the substrate, the diffracted radiation being produced by diffraction of the plurality of additional illumination spots by the additional mark. The additional projection system may be configured to modulate the diffracted radiation and project the modulated radiation onto an additional detecting system configured to produce signals corresponding to each of the plurality of additional illumination spots. The signals may be combined to determine the position of the additional mark in parallel with the measurement of the position of the mark by the alignment sensor (apparatus).

Although embodiments have described the apparatus as being a single alignment sensor, in other embodiments each illumination spot may be formed by a separate alignment sensor. Furthermore, a plurality of alignment sensors may form one or more illumination spots that are combined to form the full series of illumination spots that are incident sequentially on the mark or marks.

The illumination system may comprise illumination sub-systems. Each of the illumination sub-systems may be configured to condition at least one radiation beam from a separate one of a plurality of radiation sources to form at least one of the plurality of illumination spots. That is, a radiation beam may be produced by a radiation source and may be conditioned by an illumination sub-system to form an illumination spot. Another radiation beam may be produced by another radiation source and may be conditioned by another illumination sub-system to form an adjacent illumination spot.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device).

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for measuring a position of a mark on a substrate, the apparatus comprising:
   an illumination system configured to condition at least one radiation beam to form a plurality of illumination spots spatially distributed in series such that during scanning of the substrate, the plurality of illumination spots are incident on the mark sequentially, and
   a projection system configured to project radiation diffracted by the mark from the substrate, the diffracted radiation being produced by the diffraction of the plurality of illumination spots by the mark;
   wherein the projection system comprises a detection reference grating configured to modulate the diffracted radiation and project the modulated radiation onto a detecting system configured to produce signals corresponding to each of the plurality of illumination spots, the signals being combined to determine the position of the mark.

2. The apparatus of claim 1, wherein the illumination system is configured to direct the plurality of illumination spots such that there is a gap between adjacent illumination spots on the substrate.

3. The apparatus of claim 1, wherein the illumination system is configured to direct the plurality of illumination spots such that there is no gap between adjacent illumination spots on the substrate.

4. The apparatus of claim 1, wherein the illumination system is configured such that only one of the plurality of illumination spots is incident on the mark simultaneously.

5. The apparatus of claim 1, wherein the apparatus is for measuring the positions of a plurality of marks, wherein the illumination system is configured such that when one of the plurality of illumination spots is incident on the mark, another of the plurality of illumination spots is incident on a further mark such that the position of the further mark is determined.

6. The apparatus of claim 1, wherein the projection system comprises a movable mirror that is configured to be moved such that the diffracted radiation from each of the plurality of illumination spots is incident on one detector of the detecting system.

7. The apparatus of claim 1, wherein the illumination system is configured such that a plurality of radiation beams are conditioned to each form at least one of the plurality of illumination spots.

8. The apparatus of claim 1, wherein the illumination system comprises illumination sub-systems, wherein each illumination sub-system is configured to condition at least one radiation beam from a separate one of a plurality of radiation sources to form at least one of the plurality of illumination spots.

9. The apparatus of claim 1, wherein the detecting system is configured to produce signals such that provisional positions of the mark corresponding to each of the plurality of illumination spots are determined, and the provisional positions are combined to produce the position of the mark.

10. The apparatus of claim 1, wherein the detecting system is configured to produce signals to be combined into a combined signal that is used to produce the position of the mark.

11. A measurement system for measuring positions of marks on a substrate, the measurement system comprising:
   the apparatus of claim 1, and
   an additional apparatus comprising:
      an additional illumination system configured to condition at least one additional radiation beam to form a plurality of additional illumination spots spatially distributed in series such that during scanning of the substrate the plurality of additional illumination spots are incident on an additional mark sequentially, and an additional projection system configured to project radiation diffracted by the additional mark from the substrate;

the diffracted radiation being produced by the diffraction of the plurality of additional illumination spots by the additional mark;

wherein the additional projection system is configured to modulate the diffracted radiation and project the modulated radiation onto an additional detecting system configured to produce signals corresponding to each of the plurality of additional illumination spots, and the signals being combined to determine the position of the additional mark in parallel with the measurement of the position of the mark by the apparatus.

12. A metrology apparatus comprising the apparatus of claim 1.

13. A lithographic apparatus arranged to project a pattern from a patterning device onto a substrate, the lithographic apparatus comprising the apparatus of claim 1.

14. A method of measuring a position of a mark on a substrate, the method comprising:

providing a measurement optical system comprising an illumination system configured to condition at least one radiation beam to form a plurality of illumination spots spatially distributed in series and a projection system comprising a detection reference grating configured to project and modulate radiation diffracted from the mark;

scanning the substrate such that the plurality of illumination spots are incident on the mark sequentially, producing diffracted radiation from the plurality of illumination spots being diffracted by the mark; and projecting the modulated radiation onto a detecting system configured to produce signals corresponding to each of the plurality of illumination spots, the signals being combined to determine the position of the mark.

* * * * *